United States Patent
Handa et al.

(10) Patent No.: US 8,423,921 B2
(45) Date of Patent: Apr. 16, 2013

(54) DATA VERIFICATION METHOD AND CHARGED PARTICLE BEAM WRITING APPARATUS

(75) Inventors: Yujin Handa, Shizuoka (JP); Kei Hasegawa, Shizuoka (JP); Tomohiro Iijima, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 1005 days.

(21) Appl. No.: 12/435,718

(22) Filed: May 5, 2009

(65) Prior Publication Data

US 2009/0285494 A1 Nov. 19, 2009

(30) Foreign Application Priority Data

May 16, 2008 (JP) ................................. 2008-130211

(51) Int. Cl.
G06F 17/50 (2006.01)
(52) U.S. Cl.
USPC ................... 716/53; 716/50; 716/51; 716/52; 716/55
(58) Field of Classification Search ............. 716/50–56; 700/120–121; 378/34–35
See application file for complete search history.

(56) References Cited

U.S. PATENT DOCUMENTS

| | | | |
|---|---|---|---|
| 5,903,461 A * | 5/1999 | Rostoker et al. | 700/121 |
| 6,598,210 B2 * | 7/2003 | Miwa | 716/52 |
| 7,346,882 B2 * | 3/2008 | Abe | 716/52 |
| 7,346,886 B2 * | 3/2008 | Fukagawa et al. | 716/50 |
| 7,487,491 B2 * | 2/2009 | Oaki et al. | 716/51 |
| 7,657,863 B2 * | 2/2010 | Iijima et al. | 716/53 |
| 7,685,557 B2 * | 3/2010 | Anderson et al. | 716/50 |
| 2001/0029597 A1 * | 10/2001 | Miwa | 716/4 |
| 2008/0216046 A1 * | 9/2008 | Yoshida et al. | 716/19 |

FOREIGN PATENT DOCUMENTS

| | | |
|---|---|---|
| JP | 10-261562 | 9/1998 |
| JP | 2004-127967 | 4/2004 |
| JP | 2007-059429 | 3/2007 |
| JP | 2007-59429 | 3/2007 |

OTHER PUBLICATIONS

Office Action issued Dec. 18, 2012, in Japanese Patent Application No. 2008-130211, filed May 16, 2008 (with English-language Translation).

* cited by examiner

*Primary Examiner* — Stacy Whitmore
(74) *Attorney, Agent, or Firm* — Oblon, Spivak, McClelland, Maier & Neustadt, L.L.P.

(57) ABSTRACT

Data including information related to each area with a graphic disposed therein is inputted to the writing apparatus. The area is delimited with meshes each having a predetermined size. Next, an area value of a graphic lying within each of the meshes and its center-of-gravity position are determined. For every mesh, a check is made whether the area value is less than or equal to a predetermined value. When the area value is less than or equal to the predetermined value, a range allowable for an x coordinate of the center-of-gravity position is determined and a check is made whether an actual x coordinate falls within this range. Next, a range allowable for a y coordinate of the center-of-gravity position is determined and a check is made whether an actual y coordinate falls within this range.

12 Claims, 13 Drawing Sheets x_min x_max

X Coordinate of Center
of Gravity (μm)

X Coordinate of Center
of Gravity (μm)

X Coordinate of Center
of Gravity (μm)

X Coordinate of Center
of Gravity (μm)

DATA VERIFICATION METHOD AND CHARGED PARTICLE BEAM WRITING APPARATUS

BACKGROUND OF THE INVENTION

1. Field of the Invention

The present invention relates to a method for verifying data and a charged particle beam writing apparatus.

2. Background Art

In an electron beam writing apparatus, pattern data (CAD data) for a semiconductor integrated circuit or the like designed using a CAD system is first converted into data (layout data) of a format inputtable to the writing apparatus. Next, the layout data is converted to generate writing data. The writing data is divided into sizes in each of which an electron beam is actually shot and thereafter writing is performed every shot size.

There has been a need for a recent electron beam writing apparatus to develop the function of inspecting whether abnormality occurs in each data while performing a writing process. Suppressing a reduction in throughput due to the incorporation of the inspecting function therein becomes important in this case.

In a patent document 1, the areas of graphics in respective predetermined regions of layout data and writing data are compared with each other. When they both coincide with each other, it is estimated that each graphic contained in the layout data is contained even in the writing data in just proportion. The positions of center of gravity of the graphics in the predetermined regions of both data are compared with each other. When they both coincide with each other, it is estimated that each graphic contained in the layout data is contained even in the writing data without position displacement.

[Patent Document 1] Japanese Patent Application Laid-Open No. 2007-59429

SUMMARY OF THE INVENTION

The method of the patent document 1, however, needs a process for determining the areas and center-of-gravity positions of the respective graphics twice or more within a series of processes shown in the paragraph 0002 to verify data. Therefore, the method of the patent document 1 has a limit to achieve a further improvement in processing speed.

When writing patterns are made dense with advances in miniaturization of a semiconductor integrated circuit, the influence of backward scattering of an electron beam becomes large. Therefore, it has heretofore been practiced to suppress a variation in the dose of the electron beam by proximity effect correction processing. When each pattern is written onto a resist material placed on a substrate, for example, the pattern to be written is divided into predetermined meshes and stored energy caused by backward scattering is calculated at the position of the center of each mesh. The dose of the electron beam is corrected for every mesh in consideration of the stored energy.

When writing data overlap each other at any of the meshes in the execution of the above proximity effect correction here, a proper correction value is not obtained. A problem is likely to occur in that since this affects not only the mesh having the occurrence of their overlap but also the surrounding meshes, a resist is not exposed properly in a wide range of several tens of μm. However, even if the overlap occurs in the writing data, the conventional data verifying method could not detect it. Therefore, there has also been a demand for development of a function capable of detecting such a malfunction.

The present invention has been made in view of the foregoing. Namely, an object of the present invention is to provide a data verification method for minimizing a reduction in throughput and verifying the presence or absence of the occurrence of overlapping of data.

Another object of the present invention is to provide a charged particle beam writing apparatus for minimizing a reduction in throughput and performing writing while verifying the presence or absence of the occurrence of overlapping of data.

Other objects and advantages of the present invention will become apparent from the following description.

According to one aspect of the present invention, in a method for verifying data including information related to areas with graphics disposed therein, the data being inputted to a writing apparatus using a charged particle beam, the data is inputted to the writing apparatus. Each area contained in the data is delimited with meshes each having a predetermined size. An area value of a graphic lying within each of the meshes and a center-of-gravity position thereof are determined. Every mesh is checked whether the area value is less than or equal to a predetermined value. A range allowable for an x coordinate of the center-of-gravity position is determined using the area value when the area value is less than or equal to the predetermined value, and a check is made whether the x coordinate of the center-of-gravity position falls within the range. A range allowable for a y coordinate of the center-of-gravity position using the area value and the x coordinate of the center-of-gravity position is determined when the x coordinate of the center-of-gravity position falls within the range, and a check is made whether the y coordinate of the center-of-gravity position falls within the range. At least one of a proximity effect correction and a fog correction is performed using the area value and the center-of-gravity position when the y coordinate of the center-of-gravity position falls within the range.

According to another aspect of the present invention, in a method for verifying data including information related to areas with graphics disposed therein, the data being inputted to a writing apparatus using a charged particle beam, the data to the writing apparatus is inputted. Each area contained in the data is delimited with meshes each having a predetermined size. An area value of a graphic lying within each of the meshes and a center-of-gravity position thereof are determined. Every mesh is checked whether the area value is less than or equal to a predetermined value. A range allowable for a y coordinate of the center-of-gravity position using the area value when the area value is less than or equal to the predetermined value is determined, and a check is made whether the y coordinate of the center-of-gravity position falls within the range. A range allowable for an x coordinate of the center-of-gravity position is determined using the area value and the y coordinate of the center-of-gravity position when the y coordinate of the center-of-gravity position falls within the range, and a check is made whether the x coordinate of the center-of-gravity position falls within the range. At least one of a proximity effect correction and a fog correction is performed using the area value and the center-of-gravity position when the x coordinate of the center-of-gravity position falls within the range.

According to other aspect of the present invention, a charged particle beam writing apparatus for applying a charged particle beam to a sample thereby to write a predetermined pattern, comprises means supplied with data including information related to areas with graphics disposed therein and for delimiting each of the areas with meshes each having a predetermined size, means for determining an area value of a graphic lying within each of the meshes and a center-of-gravity position thereof, means for inspecting using the area value and the center-of-gravity position whether abnormality has occurred in the data, and means for performing a proximity effect correction using the area value and the center-of-gravity position when the abnormality is assumed not to have occurred in the data, thereby determining a dose of the charged particle beam applied to the sample.

DETAILED DESCRIPTION OF THE PREFERRED EMBODIMENTS

The present embodiment features that data are verified using area values of graphics and their center-of-gravity values calculated upon execution of proximity effect correction processing. According to this method, since there is no need to determine the area values and the center-of-gravity values newly for the data verification, computational processing is less reduced and the data verification can be carried out in a shorter period of time than conventional.

Figure 1:
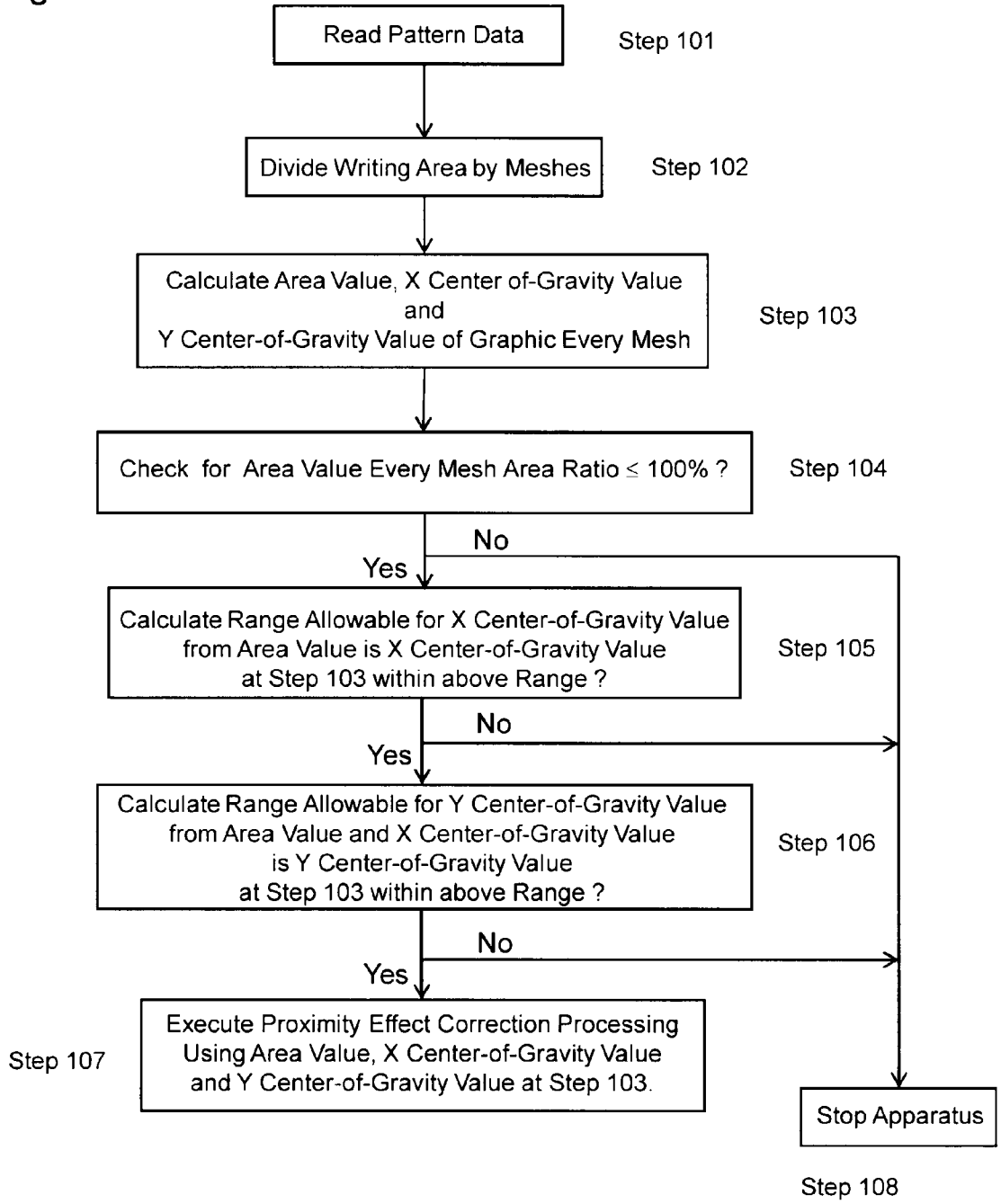
FIG. 1 is a flowchart showing a method for verifying data according to the present embodiment.

FIG. 1 is a flowchart showing a method for verifying data according to the present embodiment.

Upon a proximity effect correction, each writing pattern written by an electron beam is divided into predetermined meshes. Stored energy caused by backward scattering is calculated at the position of the center of each unit mesh. Thus, even in the present embodiment, writing data is read first at Step 101 as shown in FIG. 1. Afterwards, a writing pattern is delimited with meshes at Step 102.

Figure 2:
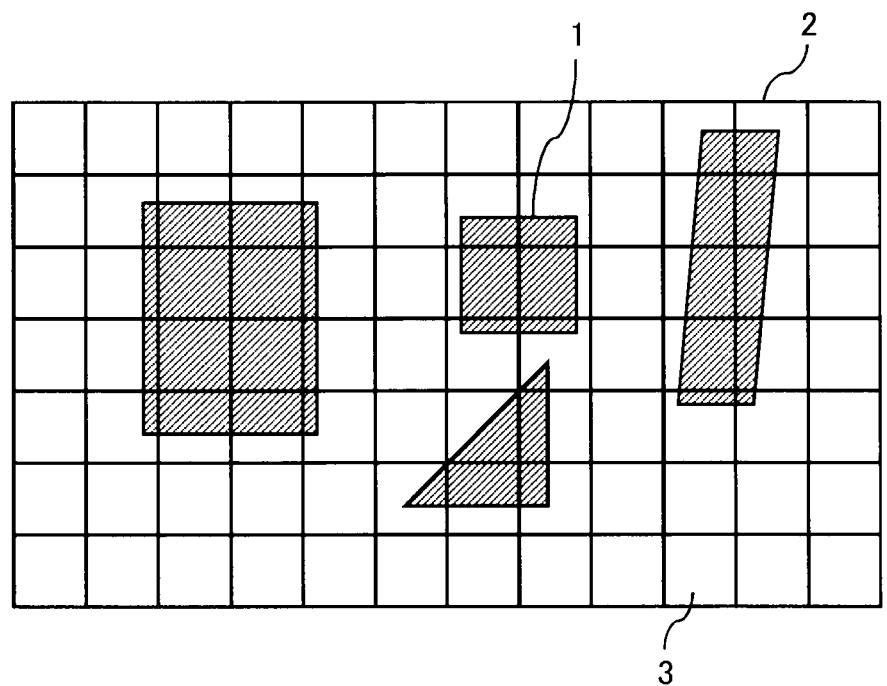
FIG. 2 is one example illustrative of writing patterns divided by meshes in the present embodiment.

As shown in FIG. 2 by way of example, a writing pattern 1 is delimited into areas (meshes 3) each surrounded by solid lines drawn or traced at intervals of 1 μm or so for each rectangular area (block 2) whose one side is a few hundred μm or so. Thus, either 0, 1 or 2 or more graphics that configure the writing pattern 1 exist within the respective meshes.

An area value of each graphic contained in the mesh and the position of its center of gravity are next calculated for each mesh (Step 103).

While the position of the center of gravity of the graphic contained in the mesh may be obtained by determining the coordinate of the center of gravity directly, the following value may be determined with respect to an x direction with the lower left corner of the mesh as a point of origin in FIG. 2.

$$gx = x \times M$$

In the above equation, gx indicates an x center-of-gravity value, x indicates the center coordinate of each graphic, and M indicates an area value of each graphic. A y center-of-gravity value is determined even in a y direction in like manner.

When a plurality of graphics are contained within the meshes, x center-of-gravity values are determined with respect to the respective graphics. A value obtained by adding these, i.e., a value obtained from the following equation is defined as an x center-of-gravity value. The y center-of-gravity value is also obtained by using the same equation.

$$gx = gx_{pattern\ 1} + gx_{pattern\ 2} + gx_{pattern\ 3} + \ldots = \sum_{i=1}^{n} gx_{pattern\ i}$$

Figure 3:
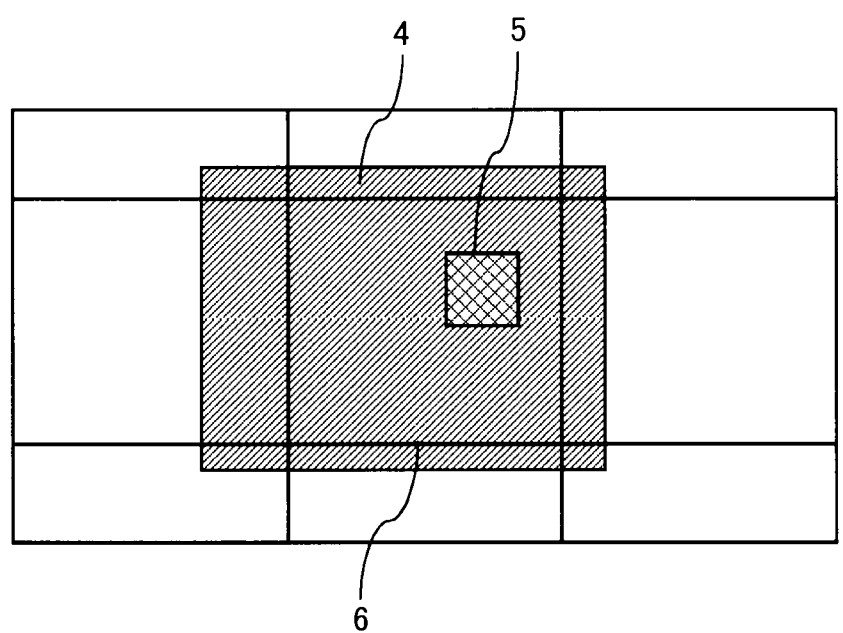
FIG. 3 is an example in which patterns overlap each other in the present embodiment.

It is next checked at Step 104 whether the area value is not greater than a predetermined value for each mesh. In the present embodiment, the ratio of the graphic area contained in each mesh to its mesh area is checked, i.e., whether the area ratio exceeds 100% or not. Since the proportion of a graphic 4 in a mesh 6 is 100% when the graphic 4 and a graphic 5 completely overlap each other as shown in FIG. 3, for example, a value obtained by adding the proportion of the graphic 5 in the mesh 6 to the proportion of the graphic 4 therein exceeds 100% when their proportions are added up. Thus, in this case, it is determined that the overlapping of patterns has occurred. The flowchart proceeds to Step 108.

When the area ratio is not greater than 100% at Step 104, the flowchart proceeds to Step 105. At Step 105, a range in which an x coordinates of the center of gravity can be taken is calculated from the area value obtained at Step 103, and a check is made whether the x center-of-gravity value obtained at Step 103 falls within this range. Step 105 will hereinafter be described in detail.

Figure 4A:
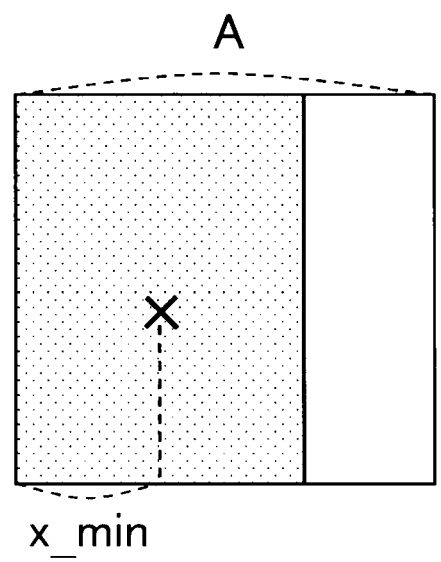
FIG. 4A is an example in which an x coordinate becomes minimum in the present embodiment and FIG. 4B is an example in which an x coordinate becomes maximum therein.
Figure 4B:
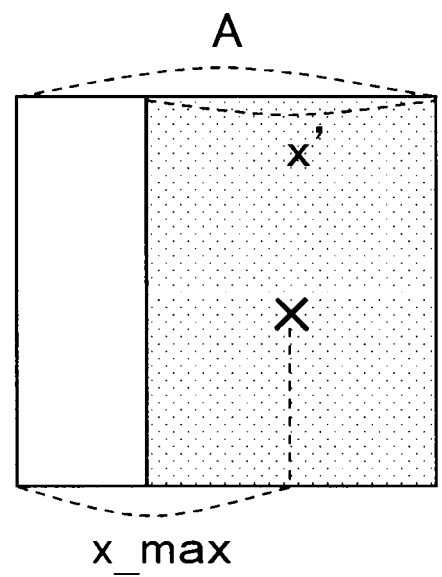
Figure 5:
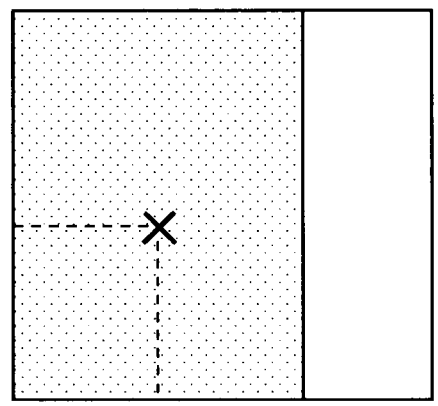
FIG. 5 is an example in which an x center-of-gravity value coincides with a minimum value lying in an allowable range in the present embodiment.

When the area value is found, a range in which the center of gravity is allowable is determined using this area value. When a certain area value M is given, for example, the x coordinate of the center of gravity becomes minimum when a graphic approaches the leftmost side within a mesh as shown in FIG. 4A. On the other hand, the x coordinate of the center of gravity becomes maximum when a graphic approaches the rightmost side within a mesh as shown in FIG. 4B. Incidentally, X marks respectively indicate the position of the center of gravity in these figures (FIGS. 5 through 7 are also similar).

Specifically, the x coordinate in FIG. 4A can be represented below using the length A of one side of the mesh and the area value M.

$$x\_min = \frac{M}{2A}$$

$$(\because 2x\_min \cdot A = M)$$

Thus, the minimum value gx_min of the x center-of-gravity value can be represented as below based on gx=x×M.

$$\text{gx\_min} = \text{x\_min} \cdot M = \frac{M^2}{2A}$$

The maximum value of the x center-of-gravity value is determined as shown below: Assuming that the length of one side of a maximized graphic is x', the maximum value (x_max) of an x coordinate of the center of gravity thereof can be expressed as follows:

$$\text{x\_max} = A - \frac{x'}{2}$$

$$\text{x\_max} = A - \frac{M}{2A}$$

$$\left( \because x' = \frac{M}{A} \right)$$

The maximum value gx_max of the x center-of-gravity value can be represented as below in a manner similar to the above.

$$\text{gx\_max} = \text{x\_max} \cdot M = A \cdot M - \frac{M^2}{2A}$$

Since gx_max=A·M−gx_min is derived from $$\text{gx\_min} = \frac{M^2}{2A}$$

here, a range in which the x center-of-gravity value is allowable is as follows:

$$\text{gx\_min} \le gx \le A \cdot M - \text{gx\_min}$$

$$\left( \text{gx\_min} = \frac{M^2}{2A} \right)$$

Thus, when it is found at Step 105 that the x center-of-gravity value falls outside the above range, it is determined that the overlapping of patterns has occurred and the flowchart proceeds to Step 108.

When it is found at Step 105 that the x center-of-gravity value falls within the range, the flowchart proceeds to Step 106. At Step 106, a range in which a y coordinate of the center of gravity is permissible is calculated from the area value and x center-of-gravity value obtained at Step 103. It is checked whether the y center-of-gravity value obtained at Step 103 is contained within the range.

When the x center-of-gravity value coincides with the minimum value in the range obtained at Step 105, for example, a graphic corresponding to this is represented as shown in FIG. 5. At this time, a y coordinate of the center of gravity of the graphic shown in FIG. 5 becomes the center of a mesh and coordinates other than it are not allowable. That is, if the area value and the x center-of-gravity value are found, then a range in which a y center-of-gravity value is allowable can be determined. Likewise, if the area value and the y center-of-gravity value are found, then a range in which an x center-of-gravity value is allowable can be determined.

As one example, consider the case when one graphic exists within each mesh.

Figure 6A:
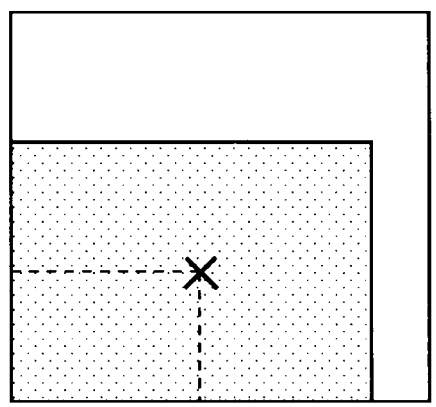
FIG. 6A is an example in which a y coordinate becomes minimum in the present embodiment and FIG. 6B is an example in which a y coordinate becomes maximum therein.
Figure 6B:
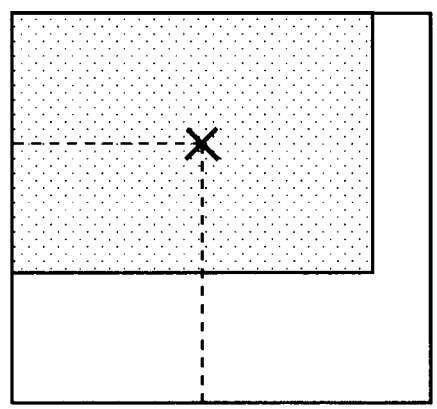

When the x center-of-gravity value obtained at Step 103 is of a value slightly larger than the minimum value in the range obtained at Step 105, the y center-of-gravity value becomes minimum when the graphic approaches the bottom of the mesh as shown in FIG. 6A. The y center-of-gravity value becomes maximum when the graphic approaches the top of the mesh as shown in FIG. 6B. In these cases, however, the x center-of-gravity values are assumed to be always constant respectively.

Next consider the case when a plurality of graphics are contained within a mesh.

Figure 7A:
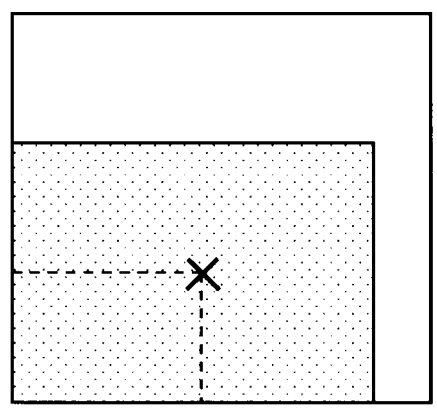
FIG. 7A is an example in which one graphic exists within a mesh in the present embodiment and FIG. 7B is an example in which two graphics exist within a mesh therein.
Figure 7B:
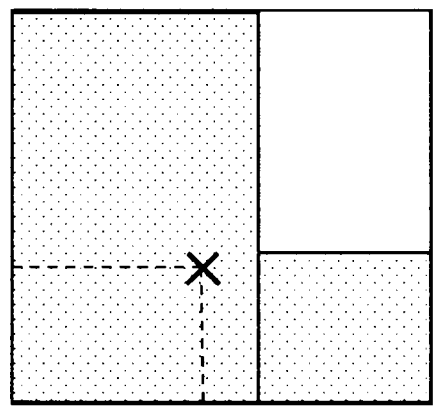

FIG. 7A shows when one graphic exists within the mesh. On the other hand, FIG. 7B is identical in area value and x center-of-gravity value to FIG. 7A and shows when two graphics exist within the mesh. In FIG. 7B, a range in which a y center-of-gravity value is allowable is slightly wider than that in FIG. 7A.

Thus, the allowable range of y center-of-gravity value changes depending on the number of graphics contained in each mesh. Therefore, the range in which the y center-of-gravity value is allowable will be considered in the following manner.

Figure 8A:
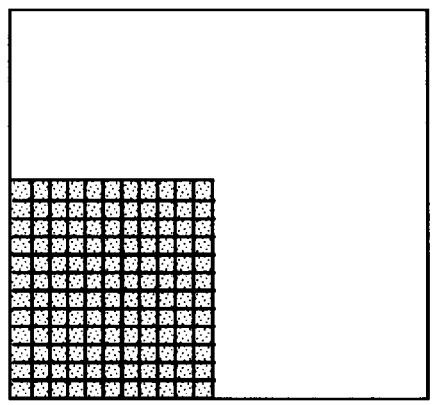
FIGS. 8A and 8B are respectively examples in which graphics are configured by assemblies of micro graphics.
Figure 8B:
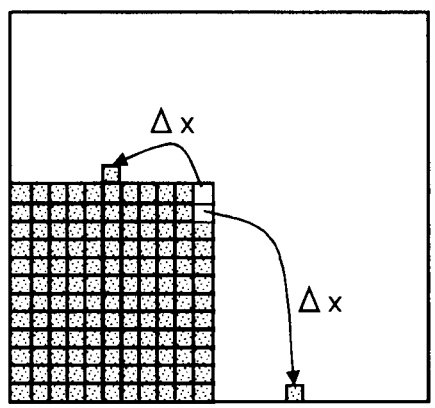

When one graphic exists in a mesh, in other words, when a pattern lying in the mesh comprises one graphic, the y center-of-gravity value becomes minimum in the case of FIG. 7A. The graphic shown in FIG. 7A is divided into a plurality of micro graphics (FIG. 8A). Next, the micro graphics shown in FIG. 8A are moved in such a manner that the y center-of-gravity value becomes small without changing the x center-of-gravity value (FIG. 8B). Specifically, in order to make the x center-of-gravity value constant, the micro graphics are Δx-moved even in a+x direction when the micro graphics are Δx-moved in a−x direction as expressed in the following equation:

$$gx = x_1 \cdot \Delta M + x_2 \cdot \Delta M + x_3 \cdot \Delta M \ldots$$
$$= x_1 \cdot \Delta M + (x_2 - \Delta x) \cdot \Delta M + (x_3 + \Delta x) \cdot \Delta M \ldots$$

(ΔM: area of micro graphic)

Figure 9A:
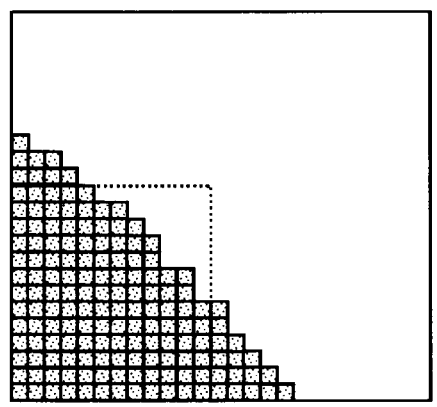
FIGS. 9A and 9B are respectively examples in which graphics are configured by assemblies of micro graphics.
Figure 9B:
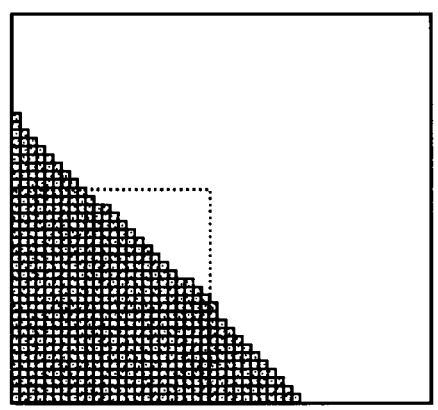
Figure 10A:
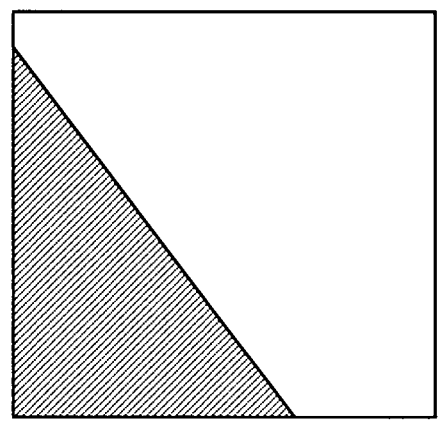
FIGS. 10A and 10B are respectively examples in which graphics are made approximate by assemblies of micro graphics.

A new graphic obtained by moving the micro graphics in the above-described manner is shown in FIG. 9A. Incidentally, a portion indicated by a broken line in FIG. 9A represents the pre-movement graphic (graphic of FIG. 7A). The graphic formed by all of the micro graphics in FIG. 9A corresponds to the case in which a y center-of-gravity value allowable for a predetermined area value and an x center-of-gravity value becomes minimal. When the micro graphics are further reduced in size, a graphic in which its y center-of-gravity value becomes minimum is represented as shown in FIG. 9B. If the size of each micro graphic is reduced to the utmost limit, then the obtained-graphic is made approximately to a triangle shown in FIG. 10A.

Figure 10B:
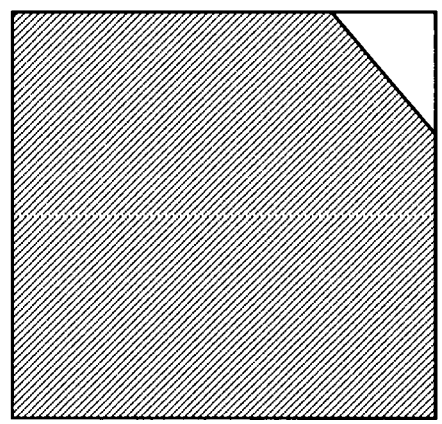

Even any pattern in the mesh can be represented if considered as an assembly of micro graphics. As a result of that the assembly of such micro graphics is moved in such a manner that its y center-of-gravity value becomes minimum, a graphic shown in FIG. 10A was obtained. It can thus be said that the graphic in which its y center-of-gravity value becomes minimum regardless of the number of patterns in each mesh, is of the triangle shown in FIG. 10A or a trapezoid shown in FIG. 10B.

Calculational expressions each of which determines the minimum or maximum value of a y center-of-gravity value using an area value and an x center-of-gravity value, will be shown below.

Table 1 shows the case when the area ratio of a graphic contained in each mesh is 50% or less.

TABLE 1

Figure 11A:
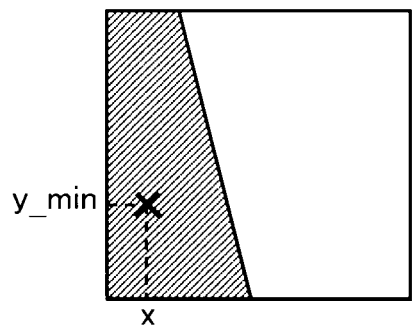
FIGS. 11A through 11E are respectively graphics in which y center-of-gravity values corresponding to respective ranges of Table 1 become minimum.
Figure 11D:
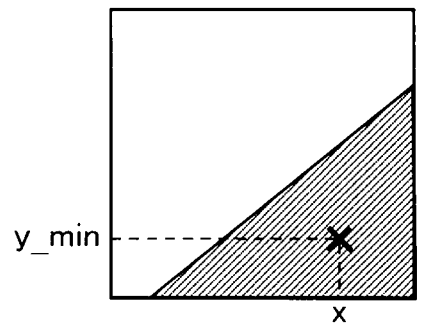
Figure 11B:
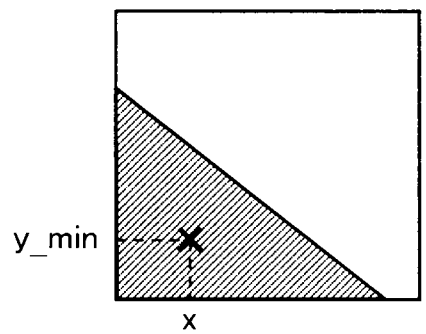
Figure 11E:
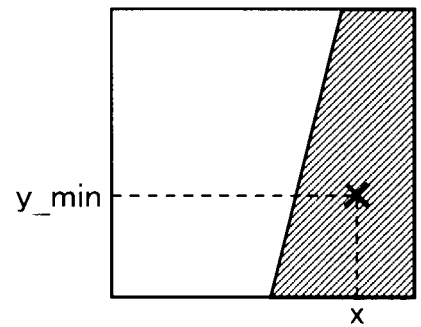
Figure 11C:
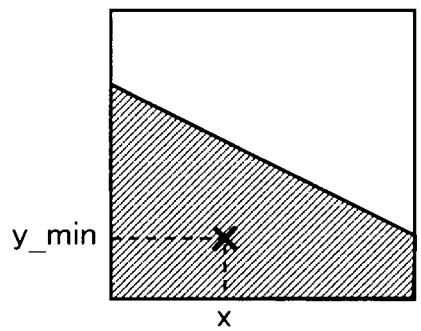

| Range of x center-of-gravity value | Calculational expression for range of y center-of-gravity value Upper stage: minimum value Lower stage: maximum value | Graphic minimal in y center-of-gravity value |
|---|---|---|
| $\frac{1}{2}\frac{M^2}{A} \sim \frac{2}{3}\frac{M^2}{A}$ | $\frac{\left(3M - \sqrt{6A^2 gx - 3M^2}\right)A}{6}$ $\frac{\left(3M + \sqrt{6A^2 gx - 3M^2}\right)A}{6}$ | FIG. 11A |
| $\frac{2}{3}\left(\frac{M}{A}\right)^2 \sim \frac{1}{3}M \cdot A$ | $\frac{2M^3}{9A \cdot gx}$ $M \cdot A - \frac{2M^3}{9A \cdot gx}$ | FIG. 11B |
| $\frac{1}{3}M \cdot A \sim \frac{2}{3}M \cdot A$ | $\frac{6gx^2 - 6Mgx + 2M^2}{A}$ $M \cdot A - \frac{6gx^2 - 6Mgx + 2M^2}{A}$ | FIG. 11C |
| $\frac{2}{3}M \cdot A \sim M - \frac{2}{3}\frac{M^2}{A}$ | $\frac{2M^3}{9(M-gx)A}$ $M \cdot A - \frac{2M^3}{9(M-gx)A}$ | FIG. 11D |
| $M \cdot A - \frac{2}{3}\frac{M^2}{A} \sim M \cdot A - \frac{1}{2}\frac{M^2}{A}$ | $\frac{\left(3M - \sqrt{-6A^2 gx - 3M^2 + 6A^2 M}\right)A}{6}$ $\frac{\left(3M + \sqrt{-6A^2 gx - 3M^2 + 6A^2 M}\right)A}{6}$ | FIG. 11E |

Graphics in which y center-of-gravity values thereof corresponding to the respective ranges of Table 1 become minimum are illustrated in FIGS. 11A through 11E. Incidentally, graphics maximal in y center-of-gravity value respectively assume graphics inverted with respect to straight lines which pass through the centers of meshes and are parallel to y axes in FIGS. 11A through 11E.

Table 2 shows the case when the area ratio of a graphic contained in each mesh is 50% or more.

TABLE 2

Figure 12A:
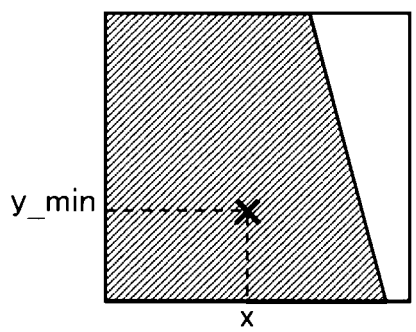
FIGS. 12A through 12E are respectively graphics in which y center-of-gravity values corresponding to respective range of Table 2 become minimum.
Figure 12D:
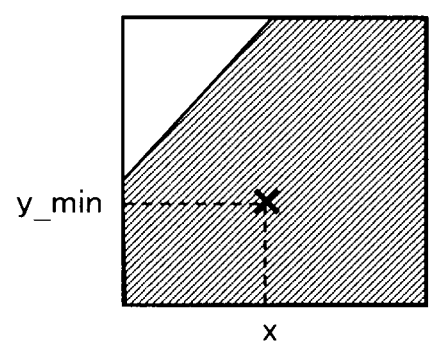
Figure 12B:
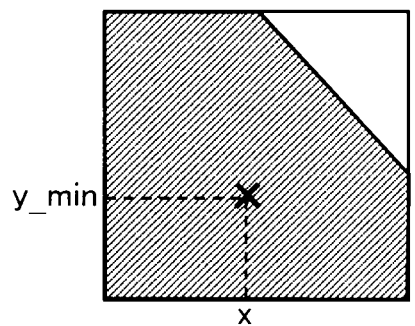

| Range of x center-of-gravity value | Calculational expression for range of y center-of-gravity value Upper stage: minimum value Lower stage: maximum value | Graphic minimal in y center-of-gravity value |
|---|---|---|
| $\frac{1}{2}\frac{M^2}{A} \sim \frac{2}{3}\frac{M^2}{A} - \frac{1}{3}M \cdot A + \frac{1}{6}A^3$ | $\frac{\left(3M - \sqrt{6A^2 gx - 3M^2}\right)A}{6}$ $\frac{\left(3M + \sqrt{6A^2 gx - 3M^2}\right)A}{6}$ | FIG. 12A |
| $\frac{2}{3}\frac{M^2}{A} - \frac{1}{3}M \cdot A + \frac{1}{6}A^3 \sim \frac{2}{3}M \cdot A - \frac{1}{6}A$ | $\frac{(-3A^2 + 6M)A^3 + (4M^2 + -8M \cdot A^2 + 4A^4)(2A - 2M/A)}{6(6gx - 6M + 3A^2)}$ $\frac{(-2M^2 + 4M \cdot A^2 - 2A^4)(2A - 2M/A)}{3(6gx - 6M + 3A^2)} + \left(\frac{1}{2}A^3\right)$ | FIG. 12B |

TABLE 2-continued

Figure 12E:
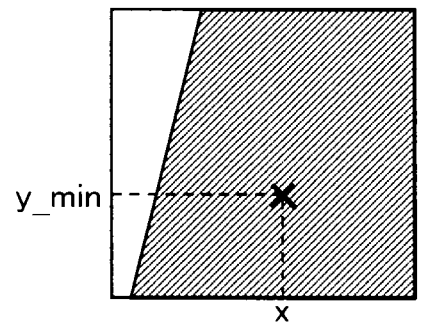
Figure 12C:
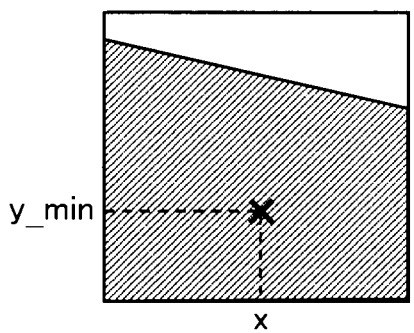

| Range of x center-of-gravity value | Calculational expression for range of y center-of-gravity value Upper stage: minimum value Lower stage: maximum value | Graphic minimal in y center-of-gravity value |
|---|---|---|
| $\frac{2}{3}M \cdot A - \frac{1}{6}A^3 \sim \frac{1}{3}M \cdot A + \frac{1}{6}A^3$ | $\frac{6gx^2 - 6Mgx + 2M^2}{A}$ $M \cdot A - \frac{6gx^2 - 6Mgx + 2M^2}{A}$ | FIG. 12C |
| $\frac{1}{3}M \cdot A - \frac{1}{6}A^3 \sim -\frac{2}{3}\frac{M^2}{A} + \frac{4}{3}M \cdot A - \frac{1}{6}A^3$ | $\frac{(2M^2 - 4M \cdot A^2 + 2A^4)(2A - 2M/A)}{9 \cdot A^2 - 18gx} + M \cdot A - \left(\frac{1}{2}A^3\right)$ $\frac{-(2M^2 - 4M \cdot A^2 + 2A^4)(2A - 2M/A)}{9A^2 - 18gx} + \left(\frac{1}{2}A^3\right)$ | FIG. 12D |
| $-\frac{2}{3}\frac{M^2}{A} + \frac{4}{3}M \cdot A - \frac{1}{6}A^3 \sim M - \frac{1}{2}\frac{M^2}{A}$ | $\frac{3M - \sqrt{-6A^2gx - 3M^2 + 6A^2M}}{6}$ $\frac{3M + \sqrt{-6A^2gx - 3M^2 + 6A^2M}}{6}$ | FIG. 12E |

Graphics in which y center-of-gravity values thereof corresponding to the respective ranges of Table 2 become minimum are illustrated in FIGS. 12A through 12E. Incidentally, graphics maximal in y center-of-gravity value respectively assume graphics inverted with respect to straight lines which pass through the centers of meshes and are parallel to y axes in FIGS. 12A through 12E.

When the y center-of-gravity value obtained at Step 103 is not contained within each of the ranges allowable for the y center-of-gravity values obtained in the above-described manner, it is determined that the overlapping of patterns has occurred, and the flowchart proceeds to Step 108. On the other hand, when it is found at Step 106 that the y center-of-gravity value falls within the above range, it can be estimated that the overlapping of patterns does not occur.

Figure 13A:
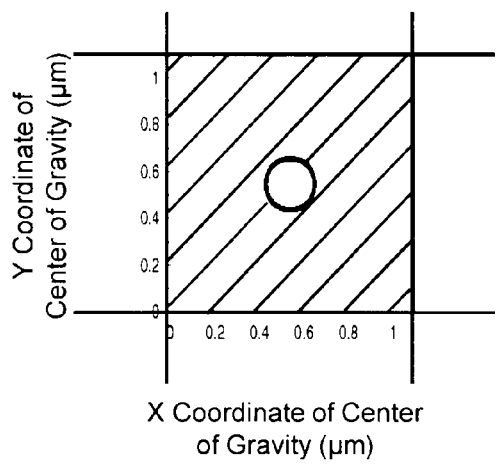
FIGS. 13A through 13D are respectively coordinate ranges of center of gravity acquired by normal patterns free of occurrence of their overlap.
Figure 13B:
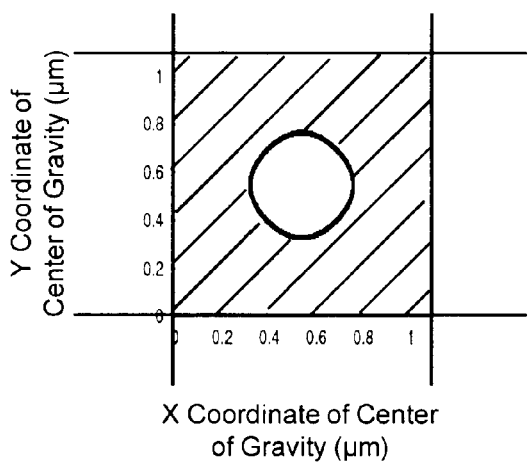
Figure 13C:
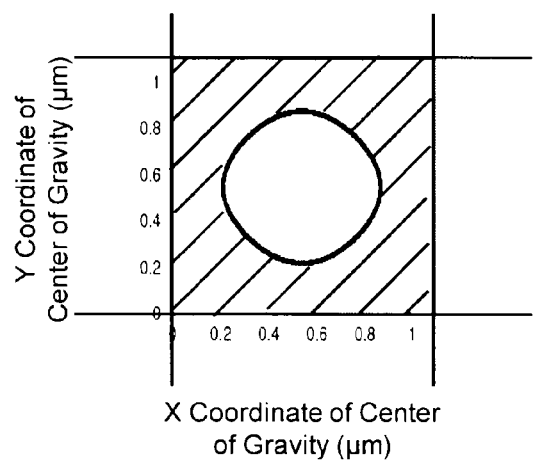
Figure 13D:
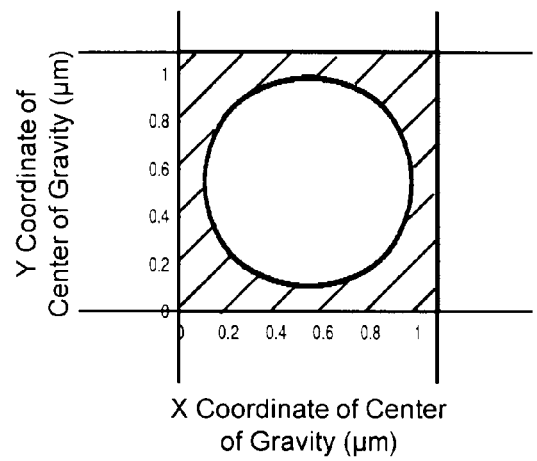

FIGS. 13A through 13D respectively show coordinate ranges of centers of gravity allowable for normal patterns free of occurrence of overlapping thereof. Here, FIG. 13A shows a case in which the area ratio of a pattern occupied within a mesh is 80%, FIG. 13B shows a case in which the area ratio is 60%, FIG. 13C shows a case in which the area ratio is 40%, and FIG. 13D shows a case in which the area ratio is 20%, respectively. In each figure, the horizontal axis indicates the x coordinate of the center of gravity, and the vertical axis indicates the y coordinate of the center of gravity. They assume converted values of the x and y center-of-gravity values referred to above. The coordinates of the centers of gravity allowable for the normal patterns are respectively located inside circular ranges. Thus, if the coordinate of the center of gravity obtained at Step 103 is placed in shaded areas, it can be then said that the respective patterns are of abnormal patterns in which their overlapping has occurred.

When the y center-of-gravity value obtained at Step 103 falls within the range allowable for the y center-of-gravity value obtained at Step 106, the flowchart proceeds to Step 107. At Step 107, proximity effect correction data is calculated from the area value and the center-of-gravity value obtained at Step 103. In the case of each mesh large in area value, for example, the irradiation time of an electron beam is made short by a proximity effect correction thereby to enable the result of writing to approach a design value. When there is a mesh in which a writing pattern is disposed with being shifted from the center, each surrounding mesh lying near the center of gravity is strongly affected by backward scattering. Thus, even in this case, the time required for the irradiation of the surrounding mesh with the electron beam is shortened by the proximity effect correction.

A charged particle beam writing apparatus according to the present embodiment will next be explained. The present apparatus can minimize a reduction in throughput and perform writing while verifying the presence or absence of the occurrence of overlapping of data. Although the electron beam is used as a charged particle beam in the present embodiment, the present invention is not limited to it, but may use other charged particle beams such as an ion beam.

Figure 14:
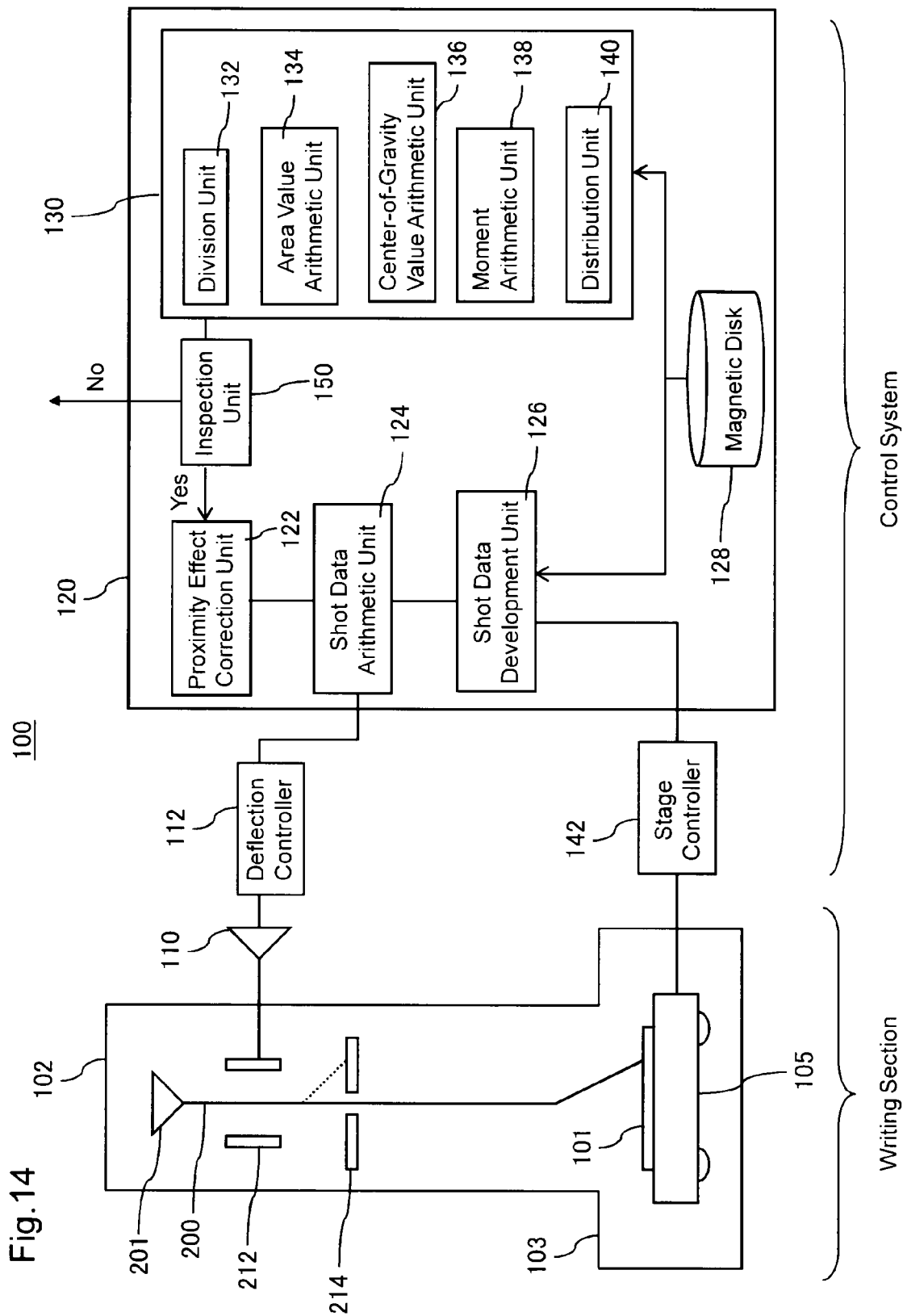
FIG. 14 is one example of a configuration diagram of an electron beam writing apparatus according to the present embodiment.

FIG. 14 shows a configuration diagram of an electron beam writing apparatus which is one example of a charged particle beam writing apparatus.

In FIG. 14, the electron beam writing apparatus 100 includes a writing section and a control system. The writing section is equipped with an electronic lens barrel 102 and a writing chamber 103. An electron gun 201, a blanking deflector 212 and a blanking aperture 214 are disposed inside the electronic lens barrel 102. An XY stage 105 is disposed inside the writing chamber 103. The control system is equipped with a deflection amplifier 110, a deflection controller 112, a writing data generator 120 and a stage controller 142. A proximity effect correction unit 122, a shot data arithmetic unit 124, a shot data expansion or development unit 126, an inspection unit 150, an arithmetic section 130 and a magnetic disk 128 are disposed in the writing data generator 120. The arithmetic section 130 includes a division unit 132, an area value arithmetic unit 134, a center-of-gravity value arithmetic unit 136, a moment arithmetic unit 138 and a distribution unit 140. The magnetic disk 128 has writing data stored therein. The writing data is inputted from the magnetic disk 128 to the arithmetic unit 130 and inputted even to the shot data development unit 126.

In the writing data generator 120, all or some of its portion excluding the magnetic disk 128 may be configured by a CPU. In this case, the CPU performs processing at the proximity effect correction unit 122, shot data arithmetic unit 124, shot data development unit 126, inspection unit 150, arithmetic section 130, etc. With the exception of the proximity effect correction unit 122, the shot data arithmetic unit 124 and the shot data development unit 126, each of the inspection unit 150 and the arithmetic section 130 may be configured by a CPU. In this case, the CPU performs processing at the inspection unit 150 and respective processing at the division unit 132, the area value arithmetic unit 134, the center-of-gravity value arithmetic unit 136, the moment arithmetic unit 138 and the distribution unit 140. Further, all or some of the writing data generator 120, proximity effect correction unit 122, shot data arithmetic unit 124, shot data development unit 126, inspection unit 150, arithmetic section 130, division unit 132, area value arithmetic unit 134, center-of-gravity value arithmetic unit 136, moment arithmetic unit 138 and distribution unit 140 may be implemented by hardware based on electrical circuits or a combination of hardware based on electrical circuits and software. Alternatively, all or some thereof may be implemented by a combination of hardware based on electrical circuits and firmware.

The shot data arithmetic unit 124 lying within the writing data generator 120 is connected to the deflection controller 112. The proximity effect correction unit 122 and the shot data development unit 126 are connected to the shot data arithmetic unit 124. The arithmetic section 130 is connected to the proximity effect correction unit 122 via the inspection unit 150. The stage controller 142 is connected to the shot data development unit 126.

An electron beam 200 emitted from the electron gun 201 is applied onto a desired position of a sample 101 placed on the XY stage 105 controlled by the stage controller 142. The stage controller 142 determines a stage velocity of the XY stage 105 from a shot density inputted from the shot data development unit 126. When the time taken for irradiation of the electron beam 200 applied onto the sample 101 reaches a value that assumes a desired dose, the electrostatic blanking deflector 212 deflects the electron beam 200 to prevent the irradiation of the sample 101 with the electron beam 200 greater than the dose. Further, the electron beam 200 is cut by the blanking aperture 214 to prevent the electron beam 200 from reaching the sample 101. A deflection voltage of the blanking deflector 212 is controlled by the deflection controller 112 and the deflection amplifier 110.

When blanking is Off, the electron beam 200 emitted from the electron gun 201 proceeds along a trajectory indicated by a solid line of FIG. 14. On the other hand, when blanking is On, the electron beam 200 emitted from the electron gun 201 proceeds along a trajectory indicated by a dotted line of FIG. 14. Incidentally, air lying inside the electronic lens barrel 102 and the writing chamber 103 provided with the XY stage 105 is exhausted by a vacuum pump (not shown), so that they are placed under pressure lower than the atmospheric pressure.

The electron beam writing apparatus 100 may be a configuration other than the above configuration. For example, an illuminating lens, a first aperture, a projection lens, a molding deflector, a second aperture, an objective lens and an objective deflector or the like may be provided within the electronic lens barrel 102. When blanking is set to Off in this case, the electron beam 200 emitted from the electron gun 201 is applied onto the whole of the first aperture having a rectangular hole by the illuminating lens. Thus, the electron beam 200 is first shaped in rectangular form. Next, the electron beam 200 transmitted through the first aperture is projected onto the second aperture by the projection lens. The position of a first aperture image on the second aperture is controlled by the molding deflector. Then, the shape and size of the beam are changed. The electron beam 200 for a second aperture image transmitted through the second aperture is focused by the objective lens and thereafter deflected by the objective deflector, which in turn is applied to a desired position of the sample 101 on the XY stage 105.

The operation of the electron beam writing apparatus 100 will next be explained while referring to FIGS. 1 and 14.

The writing data stored in the magnetic disk 128 is inputted to the arithmetic section 130 (Step 101). Next, the division unit 132 virtually divides a written pattern by meshes. The area value arithmetic unit 134 reads a graphic coordinate and size of each written pattern defined by the writing data read from the magnetic disk 128. Next, the area value arithmetic unit 134 reads a graphic code defined by the read graphic coordinate. Further, the area value arithmetic unit 134 converts the coordinate and graphic size of the written pattern from an AU unit system to a mesh unit system. Specifically, each value may be divided by a mesh size using the following equation:

$$(\text{coordinate, length})[mesh] = (\text{coordinate, length})[AU] \times N/2$$

Next, the division unit 132 delimits each pattern with meshes (Step 102). Subsequently, an area value of a graphic lying in each mesh and its center-of-gravity value are determined for every mesh (Step 103).

Specifically, the area value arithmetic unit 134 calculates the area value of each graphic from the lengths of the sides of each graphic. Assuming that, for example, the length of one side of a graphic lying in a mesh is $L_1$ as viewed in an x direction and $L_1$ as viewed in a y direction respectively, the area S of the graphic is represented as $S = L_1 \times L$. On the other hand, its center-of-gravity value is determined by the center-of-gravity value arithmetic unit 136. For example, the position of the center of gravity can be calculated from the lengths of the sides of each graphic and its coordinates. Assuming that, for example, the lower left corner of each mesh is defined as a point of origin (0, 0) and the coordinates of the vertex of a graphic lying in a mesh are $(x_1, y_1)$, its center-of-gravity position $(gx_1, gy_1)$ of the graphic can be calculated using the following expressions. However, a coordinate system is assumed to have been converted to a mesh unit system.

$$gx_1 = x_1 + L_1/2$$

$$gy_1 = y_1 + L_2/2$$

The moment arithmetic unit 138 calculates center-of-gravity moment of each graphic using the so-obtained area value and center-of-gravity value. If the center-of-gravity moment of each graphic is represented as $(S'gx_1, S'gy_1)$ in the above example, then the values thereof can be determined by the following equations:

$$S'gx_1 = S' \times gx_1$$

$$S'gy_1 = S' \times gy_1$$

Further, the distribution unit 140 performs a process for distributing each obtained area value to each of the plural vertices of the meshes in such a manner that the center-of-gravity position remains unchanged.

Next, the inspection unit 150 performs processing of Steps 104 through 106 shown in FIG. 1. Namely, the inspection unit 150 verifies using the area value and center-of-gravity value obtained at the arithmetic section 130 whether the overlapping of patterns has occurred. As a result, the proximity effect correction unit 122 performs a proximity effect correction when it is determined that the overlapping of the patterns does not occur (Step 107). Here, the area values and center-of-gravity values or the like obtained at the arithmetic section 130 are used even in the proximity effect correction processing. The details thereof can be referred to, for example, Japanese Patent Application Laid-Open No. 2007-200968.

Thereafter, a proximity effect correction amount is inputted from the proximity effect correction unit 122 to the shot data arithmetic unit 124. Further, shot data developed to the shot data arithmetic unit 124 is also inputted from the shot data development unit 126. The shot data arithmetic unit 124 calculates an electron beam dose subjected to the proximity effect correction with respect to the shot data.

The writing section performs writing based on the so-obtained electron beam dose. Specifically, the shot data arithmetic unit 124 inputs a signal to the deflection controller 112 in such a manner that the electron beam dose subjected to the proximity effect correction is reached. The deflection controller 112 irradiates the sample 101 with the electron beam 200 via the deflection amplifier 110. When the electron beam dose subjected to the proximity effect correction is reached, the voltage is applied to the blanking deflector 212 so that the electron beam 200 is deflected so as to collide with the surface of the blanking aperture 214.

Thus, according to the present embodiment, the verification of data has been performed using the area values and center-of-gravity values of the graphics calculated upon execution of the proximity effect correction processing. That is, since the process of determining an area value and a center-of-gravity value newly to verify the data is not performed, the time required for a computational process for verification can be reduced. It is thus possible to minimize a reduction in throughput and verify the presence or absence of the occurrence of data overlapping.

Incidentally, the present invention is not limited to the above embodiment but can be modified in various ways within the scope not departing from the gist of the present invention.

Although the above embodiment has described, for example, the case in which the writing data are verified, the present invention is applicable even to a method for verifying other type of data such as layout data inputtable to the writing apparatus. Further, the present invention can be also applied to a method for verifying pattern data (CAD data) of a semiconductor integrated circuit or the like designed using a CAD system.

In the above embodiment, the apparatus is deactivated at Step 108 when it is determined at Steps 104 through 106 that the overlapping of the patterns has occurred. Returning to Step 101, however, the processing may be re-executed. Alternatively, the writing process may be stopped.

Further, although the data have been verified using the area values and center-of-gravity values of the graphics calculated upon execution of the proximity effect correction processing in the above embodiment, the present verification may be done using data calculated upon execution of a fog correction. This will be explained below.

It has heretofore been known a phenomenon that electrons applied to a sample are reflected and further multi-reflected repeatedly by an inner wall of a writing chamber, followed by being returned onto the sample again. It has also been known that when an electron beam is applied onto a sample, an electromagnetic wave such as X rays occurs therein and after the electromagnetic wave is also been reflected within a writing chamber, it is launched onto the sample again. The electrons and the electromagnetic wave other than the electron beam to be applied onto the sample originally are called "fog". When an area distribution exists in a pattern written onto the sample, a distribution occurs in the dose on the sample due to "fog" with a spot large in area as a source of its occurrence. As a result, the size of each written pattern becomes nonuniform (lacks uniformity).

It has been practiced to perform a fog correction and suppress the distribution of a dose for the purpose of solving the above problems (refer to, for example, Japanese Patent Application Laid-Open No. Hei 11(1999)-204415). Thus, it is possible to verify, using area values of graphics and center-of-gravity values thereof both calculated upon execution of the fog correction, whether the overlapping of data occurs, in a manner similar to the proximity effect correction.

Specifically, when the present invention is assumed to be a method for verifying writing data each of which includes information related to an area with each graphic disposed therein and is inputted to a writing apparatus using a charged particle beam, a proximity effect correction can be carried out using the area value and the center-of-gravity value at Step 103 when the y coordinate of the center-of-gravity position falls within the obtained range at Step 106. When the present invention is assumed to be a method for verifying layout data each of which includes information related to each area with a graphic disposed therein and is inputted to a writing apparatus using a charged particle beam, a fog correction can be done using the area value and the center-of-gravity value at Step 103 when the y coordinate of the center-of-gravity position falls within the obtained range at Step 106.

In either case, a range allowable for the y coordinate of a center-of-gravity position is determined using its corresponding area value, and a check may be made whether the y coordinate of an actual center-of-gravity position falls within this range. If the y coordinate falls within the range in this case, then a range allowable for the x coordinate of the center-of-gravity position is determined using the area value and the y coordinate of the center-of-gravity position is determined, and a check is made whether the x coordinate of an actual center-of-gravity position falls within the range. When the x coordinate falls within the range, a proximity effect correction or fog correction is performed using the area value and the center-of-gravity position.

The features and advantages of the present invention may be summarized as follows.

According to the first and second aspects of the present invention, a reduction in throughput is minimized and the presence or absence of the occurrence of overlapping of data can be verified.

According to the third aspect of the present invention, a reduction in throughput is minimized and writing can be performed while the presence or absence of the occurrence of overlapping of data is being verified.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-130211, filed on May 16, 2008 including specification, claims, drawings and summary, on which the Convention priority of the present application is based, are incorporated herein by reference in its entirety.

What is claimed is:

1. A method for verifying data including information related to areas with graphics disposed therein, the data being inputted to a writing apparatus that uses a charged particle beam, comprising:
    inputting data to a first arithmetic unit;
    delimiting each area contained in the data with meshes each having a predetermined size via a division unit;

determining an area value of a graphic lying within each of the meshes via a second arithmetic unit and a center-of-gravity position thereof via a third arithmetic unit;

checking for every mesh whether the area value is less than or equal to a predetermined value via an inspection unit;

determining a range allowable for an x coordinate of the center-of-gravity position using the area value when the area value is less than or equal to the predetermined value, and checking whether the x coordinate of the center-of-gravity position falls within the range;

determining a range allowable for a y coordinate of the center-of-gravity position using the area value and the x coordinate of the center-of-gravity position when the x coordinate of the center-of-gravity position falls within the range, and checking whether the y coordinate of the center-of-gravity position falls within the range; and performing at least one of a proximity effect correction and a fog correction using the area value and the center-of-gravity position when the y coordinate of the center-of-gravity position falls within the range via a correction unit.

2. The method according to claim 1, wherein when the data is writing data, and the x coordinate of the center-of-gravity position falls within the range, a proximity effect correction is performed using the area value and the center-of-gravity position.

3. The method according to claim 1, wherein when the data is layout data, and the x coordinate of the center-of-gravity position falls within the range, a fog correction is performed using the area value and the center-of-gravity position.

4. A method for verifying data including information related to areas with graphics disposed therein, the data being inputted to a writing apparatus that uses a charged particle beam, comprising:

inputting data to a first arithmetic unit;

delimiting each area contained in the data with meshes each having a predetermined size via a division unit;

determining an area value of a graphic lying within each of the meshes via a second arithmetic unit and a center-of-gravity position thereof via a third arithmetic unit;

checking for every mesh whether the area value is less than or equal to a predetermined value via an inspection unit;

determining a range allowable for a y coordinate of the center-of-gravity position using the area value when the area value is less than or equal to the predetermined value, and checking whether the y coordinate of the center-of-gravity position falls within the range;

determining a range allowable for an x coordinate of the center-of-gravity position using the area value and the y coordinate of the center-of-gravity position when the y coordinate of the center-of-gravity position falls within the range, and checking whether the x coordinate of the center-of-gravity position falls within the range; and performing at least one of a proximity effect correction and a fog correction using the area value and the center-of-gravity position when the x coordinate of the center-of-gravity position falls within the range via a correction unit.

5. The method according to claim 4, wherein when the data is writing data, and the x coordinate of the center-of-gravity position falls within the range, a proximity effect correction is performed using the area value and the center-of-gravity position.

6. The method according to claim 4, wherein when the data is layout data and the x coordinate of the center-of-gravity position falls within the range, a fog correction is performed using the area value and the center-of-gravity position.

7. A charged particle beam writing apparatus for verifying data, including information related to areas with graphics, and applying a charged particle beam to a sample thereby to write a predetermined pattern, comprising:

a first arithmetic unit for inputting data;

a division unit for delimiting each area contained in the data with meshes each having a predetermined size;

a second arithmetic unit for determining an area value of a graphic lying within each of the meshes;

a third arithmetic unit for determining the center-of-gravity position thereof;

an inspection unit for checking for every mesh whether the area value is less than or equal to a predetermined value, determining a range allowable for an x coordinate of the center-of-gravity position using the area value when the area value is less than or equal to the predetermined value, and checking whether the x coordinate of the center-of-gravity position falls within the range, determining a range allowable for a y coordinate of the center-of-gravity position using the area value and the x coordinate of the center-of-gravity position when the x coordinate of the center-of-gravity position falls within the range, and checking whether the y coordinate of the center-of-gravity position falls within the range; and a correction unit for performing at least one of a proximity effect correction and a fog correction using the area value and the center-of-gravity position when the y coordinate of the center-of-gravity position falls within the range.

8. The apparatus according to claim 7, wherein when the data is writing data, and the x coordinate of the center-of-gravity position falls within the range, a proximity effect correction is performed using the area value and the center-of-gravity position.

9. The apparatus according to claim 7, wherein when the data is layout data, and the x coordinate of the center-of-gravity position falls within the range, a fog correction is performed using the area value and the center-of-gravity position.

10. A charged particle beam writing apparatus for verifying data, including information related to areas with graphics, and applying a charged particle beam to a sample thereby to write a predetermined pattern, comprising:

a first arithmetic unit inputting data;

a division unit delimiting each area contained in the data with meshes each having a predetermined size;

a second arithmetic unit for determining an area value of a graphic lying within each of the meshes and a center-of-gravity position thereof;

an inspection unit for checking for every mesh whether the area value is less than or equal to a predetermined value, determining a range allowable for a y coordinate of the center-of-gravity position using the area value when the area value is less than or equal to the predetermined value, and checking whether the y coordinate of the center-of-gravity position falls within the range, determining a range allowable for an x coordinate of the center-of-gravity position using the area value and the y coordinate of the center-of-gravity position when the y coordinate of the center-of-gravity position falls within the range, and checking whether the x coordinate of the center-of-gravity position falls within the range;

a correction unit for performing at least one of a proximity effect correction and a fog correction using the area value and the center-of-gravity position when the x coordinate of the center-of-gravity position falls within the range.

11. The apparatus according to claim 10, wherein when the data is writing data, and the x coordinate of the center-of-gravity position falls within the range, a proximity effect correction is performed using the area value and the center-of-gravity position.

12. The apparatus according to claim 10, wherein when the data is layout data, and the x coordinate of the center-of-gravity position falls within the range, a fog correction is performed using the area value and the center-of-gravity position.

* * * * *